United States Patent
Brownlow et al.

(10) Patent No.: US 6,236,256 B1
(45) Date of Patent: May 22, 2001

(54) VOLTAGE LEVEL CONVERTERS

(75) Inventors: Michael James Brownlow, Sandford on Thames; Graham Andrew Cairns, Cutteslowe, both of (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/272,267

(22) Filed: Mar. 19, 1999

(30) Foreign Application Priority Data

Mar. 20, 1998 (GB) .................................................. 9805882

(51) Int. Cl.$^7$ ...................................................... H03K 5/00
(52) U.S. Cl. ................................ 327/333; 327/62; 327/68
(58) Field of Search .......................... 327/333, 68, 408, 327/437, 427, 407; 326/61, 62, 63, 80

(56) References Cited

U.S. PATENT DOCUMENTS

| | | | |
|---|---|---|---|
| 3,835,457 | 9/1974 | Yu | 340/173 |
| 3,925,689 | 12/1975 | Rubenstein | 326/70 |
| 5,099,143 | * 3/1992 | Arakawa | 327/408 |
| 5,457,420 | * 10/1995 | Asada | 327/437 |
| 5,818,280 | * 10/1998 | Martin | 327/374 |

FOREIGN PATENT DOCUMENTS

| | | | |
|---|---|---|---|
| 0215280A1 | 3/1987 | (EP) . | |
| 0215288A1 | 3/1987 | (EP) . | |
| 0218940A1 | 4/1987 | (EP) . | |
| 1263128 | 2/1972 | (GB) . | |
| 1514964 | 6/1978 | (GB) . | |
| 402134918 | * 5/1990 | (JP) | 327/333 |
| 403157011 | * 7/1991 | (JP) | 327/333 |

OTHER PUBLICATIONS

GB 9805882.9 Search Report.

* cited by examiner

Primary Examiner—Tuan T. Lam
Assistant Examiner—Hiep Nguyen
(74) Attorney, Agent, or Firm—Renner, Otto, Boisselle & Sklar

(57) ABSTRACT

A voltage level converter for converting an input signal at a first voltage level to an output signal at a second voltage level, the converter comprises: an input for receiving said input signal; an output for outputting said output signal; a circuit node; precharge means for charging or discharging said circuit node to a third voltage level during a first time period by connection of said circuit node to a first voltage supply; isolation means for isolating said circuit node from said first voltage supply during a second time period; input means for changing the voltage at said circuit node in dependence on the voltage at said input during a third time period; and output means arranged so that the voltage at said output depends on the voltage at said circuit node.

20 Claims, 5 Drawing Sheets

A: (152.533n .08021) B: (167.769n 5.94723) DELTA: 15.2355n -132.98m) SLOPE: -8.72831M

VOLTAGE LEVEL CONVERTERS

TECHNICAL FIELD OF THE INVENTION

The invention relates to voltage level converters, and is useful in inter alia high speed CMOS circuits which receive many data inputs at a voltage significantly less than the supply voltage. The invention is of particular use in the field of monolithic digital data drivers for active matrix displays. In these circuits low performance TFT circuitry requires a high supply voltage to achieve the necessary speed of operation, whereas to minimise power consumption low voltage inputs are desirable.

DESCRIPTION OF THE RELATED ART

The simplest. type of prior art digital level shifter is shown in FIG. 1, and described in detail in A. Bellaouar, M. Elmasry. *Low Power Digital VLSI Design*. Kluwer Academic Publishers, 1995. The circuit consists of two CMOS inverters 2 and 4, each comprising a p-type (PMOS) transistor M1, M3 and an n-type (NMOS) transistor M2, M4. The first CMOS inverter 2 is powered by a supply voltage VDD1, and the second CMOS inverter 4 is powered by a larger supply voltage VDD2. The main disadvantage of this circuit is that the power consumption is considerable since both transistors M3 and M4 in the second inverter 4 conduct when the output of the first inverter 2 is high, ie. equal to VDD1. One of the basic criteria for minimising power consumption is that there should be no direct current path between the supply voltages and ground.

A further prior art circuit is shown in FIG. 2, and described in detail in U.S. Pat. No. 4,486,670. This circuit overcomes the problem of direct power consumption by using a latch (consisting of the four transistors M5, M6, M7 and M8) to ensure that if one of the complementary transistors M3 or M4 is turned on, the other is turned off.

A widely used level shift circuit with improved latching action is shown in the prior art circuit of FIG. 3, and described in detail in U.S. Pat. No. 4,845,381. Two CMOS inverters 6 and 8, made up of transistors M1, M2 and M4, M5 respectively, receive complementary digital input signals INPUT and INPUT*, varying between voltages of VDD1 and GND. The outputs 9 and 11 of the inverters 6 and 8 are cross-coupled and applied to the gates of the p-type transistors M3 and M6 which control the supply of a higher voltage VDD2 to the inverters 6 and 8. If the input signal INPUT is at VDD1 (ie. logic high) and the complementary input INPUT* is at ground, then transistors M1, M5 and M6 are on whilst transistors M2, M3 and M4 are off. Thus the output 13 of the shift circuit as a whole is at voltage VDD2 (ie. logic high). The main limitation of this approach for large numbers of inputs is the need to supply two complementary input signals.

SUMMARY OF THE INVENTION

According to the invention there is provided a voltage level converter for converting an input signal at a first voltage level to an output signal at a second voltage level, the converter comprising an input for receiving said input signal, an output for outputting said output signal, a circuit node, precharge means for charging or discharging said circuit node to a third voltage level during a first time period by connection of said circuit node to a first voltage supply, isolation means for isolating said circuit node from said first voltage supply during a second time period, input means for changing the voltage at said circuit node in dependence on the voltage at said input during a third time period, and output means arranged so that the voltage at said output depends on the voltage at said circuit node.

Such a level converter does not require a complementary input signal, which is particularly advantageous if a number of such level converters are used in an arrangement having a large number of inputs. In addition, the isolation means can be used to prevent a direct current path from the first voltage supply to ground, thus reducing power consumption.

Said third voltage level may be substantially equal to said second voltage level.

This allows said first voltage supply to be used for both said output signal and for charging or discharging said circuit node.

Said third time period may coincide with, or lie within, said second time period.

The voltage level converter may further comprise an input node which is charged or discharged to a fourth voltage level during said first time period by connection of said input node to a second voltage supply.

Said isolation means may isolate said input node from said second voltage supply during said second time period.

Said second voltage supply may be negatively biased with respect to said input signal.

Said isolation means may comprise a first isolation field effect transistor the source and drain of which are connected between said second voltage supply and said input node.

Said isolation means may comprise a second isolation field effect transistor the source and drain of which are connected between said first voltage supply and said circuit node.

Said input means may comprise a sampler for sampling said input signal during said third time period.

Said sampler may comprise a sampling field effect transistor the gate of which is connected to a sampling signal.

The source and drain of said sampling field effect transistor may be connected between said input and said input node.

The voltage level converter may further comprise a latch for latching said output signal at the voltage determined by said input means.

The voltage level converter may further comprise a feedback field effect transistor, the source and drain of which are connected between said first voltage supply and said input node, and the gate of which is connected to said circuit node.

This provides the advantage of increased switching speed of the level converter, by increasing the switching speed of the input transistor mentioned below.

Said output means may comprise a CMOS inverter, the input of which is connected to said circuit node.

Said input means may comprise an input field effect transistor arranged to discharge said circuit node if said input signal is at a logic high level during said third time period.

The source and drain of said input field effect tristor may be connected between said circuit node and said second voltage supply, and the gate of said input field effect transistor may be connected to said input node.

The source of said input field effect transistor may be connected to said second voltage supply.

This provides the advantage that, if said second voltage supply is negatively biased with respect to said input signal, the drive efficacy of the input signal is increased.

The gate of said input field effect transistor may be connected to said negative voltage supply during said first time period, and isolated from said negative supply during said second time period.

Said input and output signals may be digital signals.

The invention also provides an active matrix liquid crystal display comprising a voltage level converter as described above.

BRIEF DESCRIPTION OF THE DRAWINGS

Embodiments of the invention will now be described, by way of example only, with reference to the accompanying drawings, in which.

DETAILED DESCRIPTION OF THE INVENTION

Figure 1:
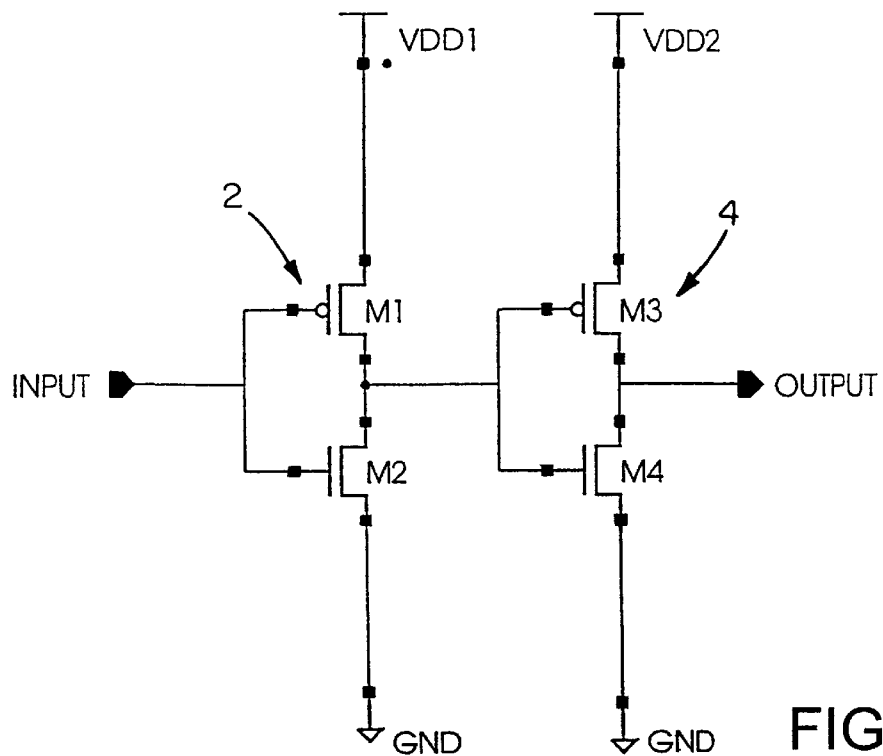
FIGS. 1 to 3 show three prior art level converters, as discussed above.
Figure 2:
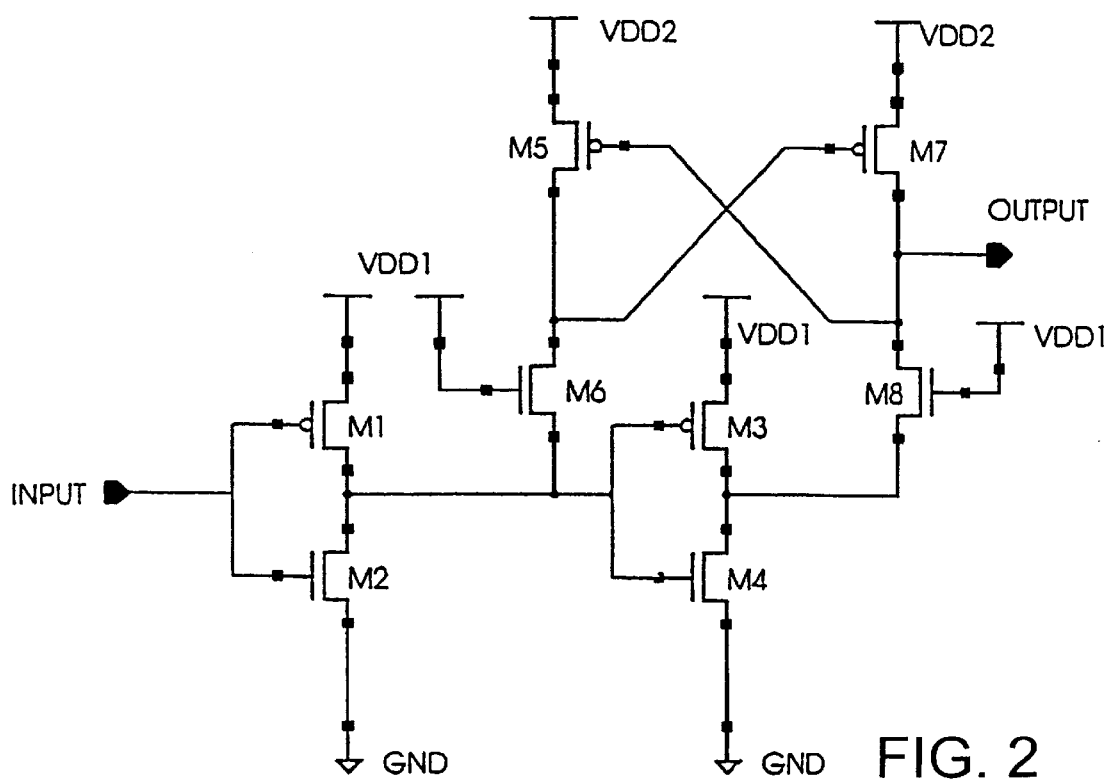
Figure 3:
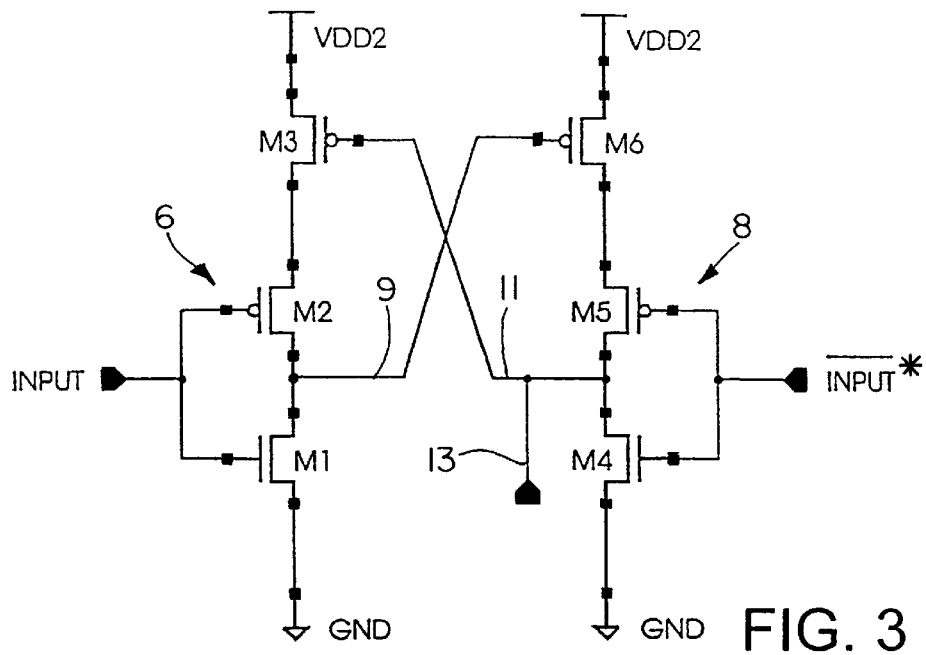
Figure 4:
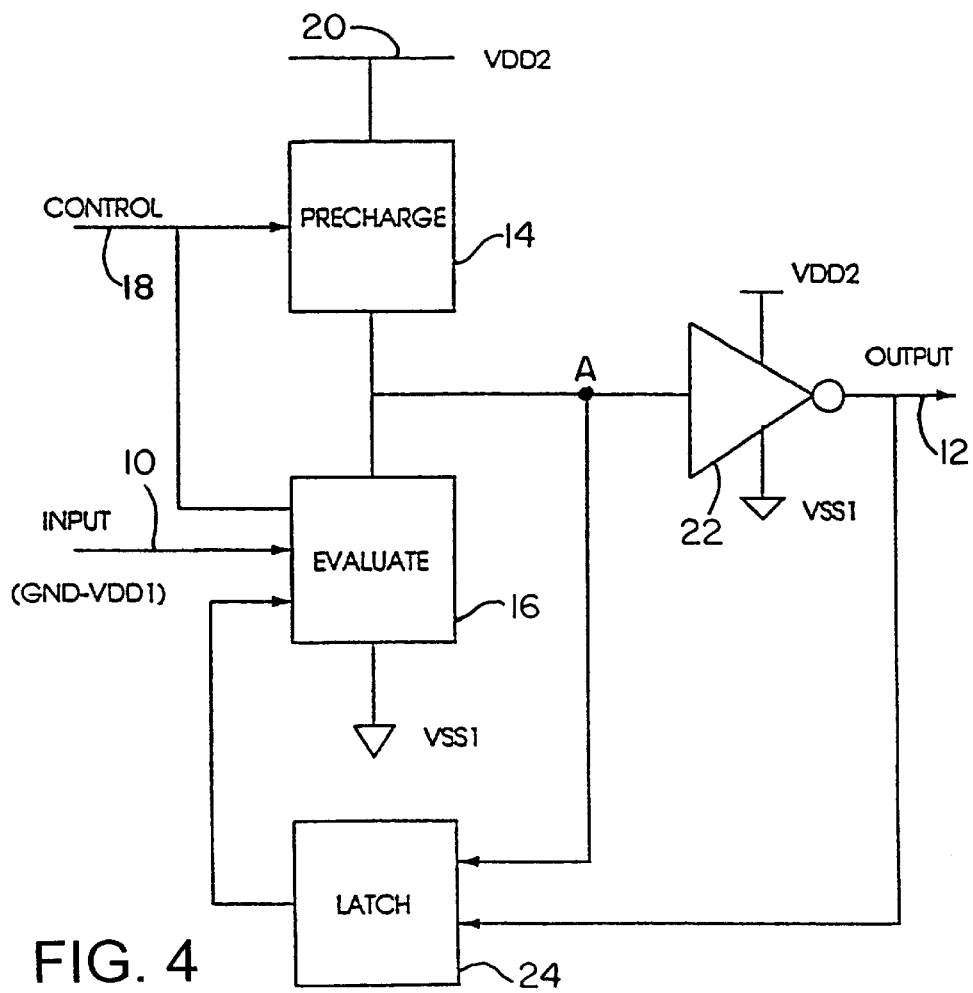
FIG. 4 shows a block diagram illustrating the basic components of an embodiment of the invention.

The basic components of an embodiment of the invention are shown in FIG. 4. A digital input signal 10, varying between ground and a voltage VDD1 (for logic levels 0 and 1 respectively) is converted to a digital output signal 12, varying between ground and a higher voltage VDD2. Precharge and evaluate blocks 14 and 16 respectively are controlled by a control signal 18. The precharge block 14 charges node A to voltage VDD2 during a standby phase, by connecting node A to a voltage supply 20. The precharge block 14 subsequently isolates node A from the voltage supply 20 during an active phase.

During the active phase, the input signal 10 is sampled by the evaluate block 16. If the input signal 10 is high, then the evaluate block 16 discharges node A, and an inverter 22 produces a high output signal 12, which is at the voltage VDD2. The evaluate block 16 and the inverter 22 are connected to a bias voltage VSS1 which is negative with respect to the ground voltage (corresponding with the input signal logic level 0) mentioned above. The negative bias voltage VSSI increases the drive efficacy and switching speed of the evaluate block 16. A latch 24 is also provided in order to latch the output signal 12 at a high level once node A has been discharged.

If the sampled input signal 10 is low, then the evaluate block 16 does not discharge node A, and the output signal 12 remains low (ie. at ground).

Figure 5:
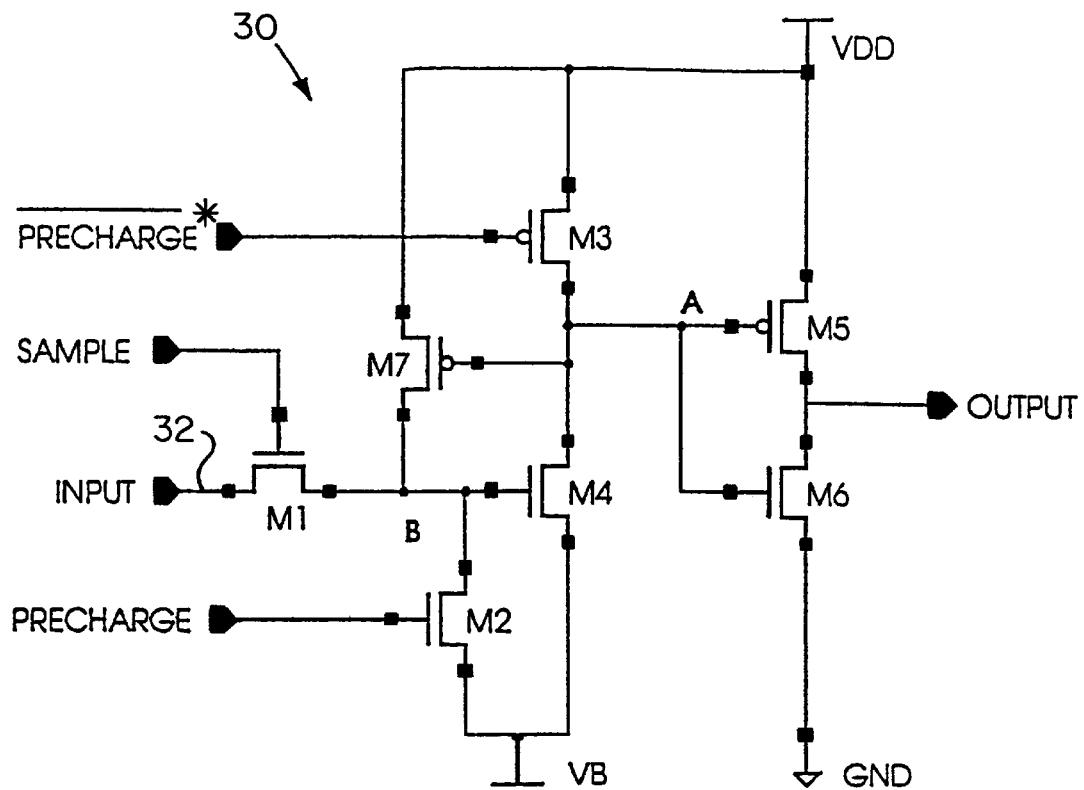
FIG. 5 shows a specific circuit level schematic of one embodiment of the invention.

FIG. 5 illustrates one way of implementing the arrangement of FIG. 4 using seven field effect transistors M1 to M7 to form a digital data interface 30. Transistor M1 is an input sampling transistor controlled by a signal SAMPLE in order to sample an input signal INPUT. The input signal INPUT is a digital signal varying between ground and a low voltage level (eg. 3.3 volts) representing logic states 0 and 1 respectively. The digital data interface 30 of FIG. 5 converts the digital input signal to a digital output signal OUTPUT which varies between ground and a higher voltage level VDD, typically around 12 volts. Transistors M5 and M6 form a conventional CMOS inverter, of which node A forms the input Transistors M3 and M4 form a precharge—evaluate type inverter, and M7 is a feedback transistor. M7 can be regarded as forming part of the latch 24 of FIG. 4.

The gates of NMOS transistor M2 and PMOS transistor M3 are respectively connected to a precharge signal PRECHARGE and a complementary signal PRECHARGE*. M2 can be regarded as forming part of the precharge block 14 of FIG. 4.

The sources of NMOS transistors M2 and M4 are connected to a negative source bias supply VB, of magnitude less than the threshold voltage of the n-type transistors M2 and M4.

The digital data interface 30 of FIG. 5 operates as follows:

1. In a standby phase the PRECHARGE signal is high NMOS transistor M2 discharges the gate of NMOS transistor M4 (node B), while PMOS transistor M3 charges the input (node A) of the output CMOS inverter (M5, M6) up to voltage VDD. In this condition there is no conducting path from the supply voltage VDD to ground so quiescent power consumption is determined only by leakage currents in M4 and M5.

2. In a subsequent active phase the PRECHARGE signal goes low, isolating node A from the power supply voltage VDD by switching off M3. Similarly node B is isolated from the negative supply voltage VB because M2 is switched off. Nodes A and B therefore remain high and low respectively.

3. Next the SAMPLE signal goes momentarily high, switching on M1 and charging node B to the voltage currently on the data input line 32. The SAMPLE signal then goes low, isolating node B from the input.

4. If the sampled input signal is low, ie. OV, then the gate-source voltage across M4 remains below threshold and so the input transistor M4 does not conduct. Node A therefore remains at the precharged high voltage and the output remains low.

5. If the sampled input signal is high (e.g. 3.3V) then the gate-source voltage of the input transistor M4 is equal to the logic high voltage (eg. 3.3V) minus the negative source bias voltage VB. Because this potential exceeds the threshold voltage of M4, M4 begins to conduct. As M4 discharges node A, the feedback transistor M7 begins to turn on as a result of the dropping voltage at its gate, thus charging node B higher. This turns on M4 harder and node A discharges more quickly. The final state of the circuit is with node B equal to VDD and node A equal to the source bias voltage VB. In this state there is no quiescent power consumption, apart from leakage effects, and the output is at VDD, ie. high.

The low voltage input signal is able to drive the output significantly faster than the prior art because the load transistor M3 can only conduct in the standby state, and the input transistor M4 therefore only has to conditionally discharge the capacitance at the output node A. The negative source bias voltage VB also increases the switching speed by creating a larger gate overdrive for the input transistor M4.

The use of a low input data voltage inherently reduces the power consumption resulting from the input signals driving parasitic capacitances. The power consumption of the interface 30 is also low because the dynamic technique avoids simultaneous conduction of the input and load transistors M4 and M3. Furthermore, the DC power consumption is negligible in both the precharged state and the latched state.

The circuit requires only a small number of transistors and so is very area efficient.

The source bias input VB can be set to the optimum value for the threshold voltage of a given process. This flexibility is particularly important for TFT implementations which exhibit wide process variations.

Figure 6:
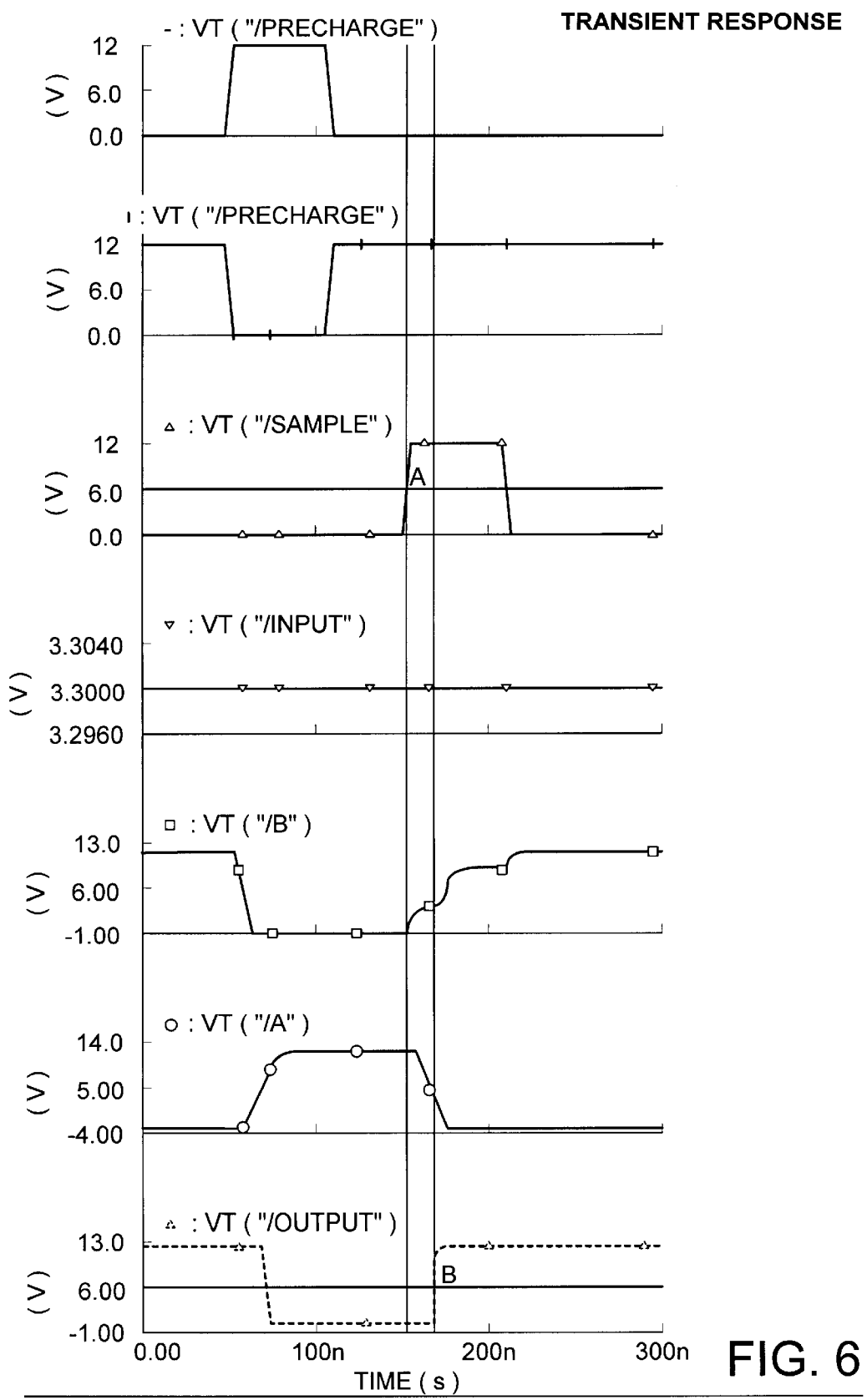
FIG. 6 shows a simulation of voltages in the circuit of FIG. 5.

FIG. 6 is a simulation of voltages in the circuit of FIG. 5, showing the timing of the relevant signals. From top to bottom, FIG. 6 shows the variation of the following voltages, PRECHARGE, PRECHARGE*, SAMPLE, INPUT, Node B, Node A, OUTPUT. The simulation uses an approximation for polysilicon thin film transistors (TFTs) with high threshold voltages of ±4V. The digital input level is 3.3V. It is clear from this simulation that the delay between the OUPUT high and the sample pulse is of the order of 15 nS, illustrating high speed operation, despite poor performance of the polysilicon TFTs.

Figures 7A, 7B:
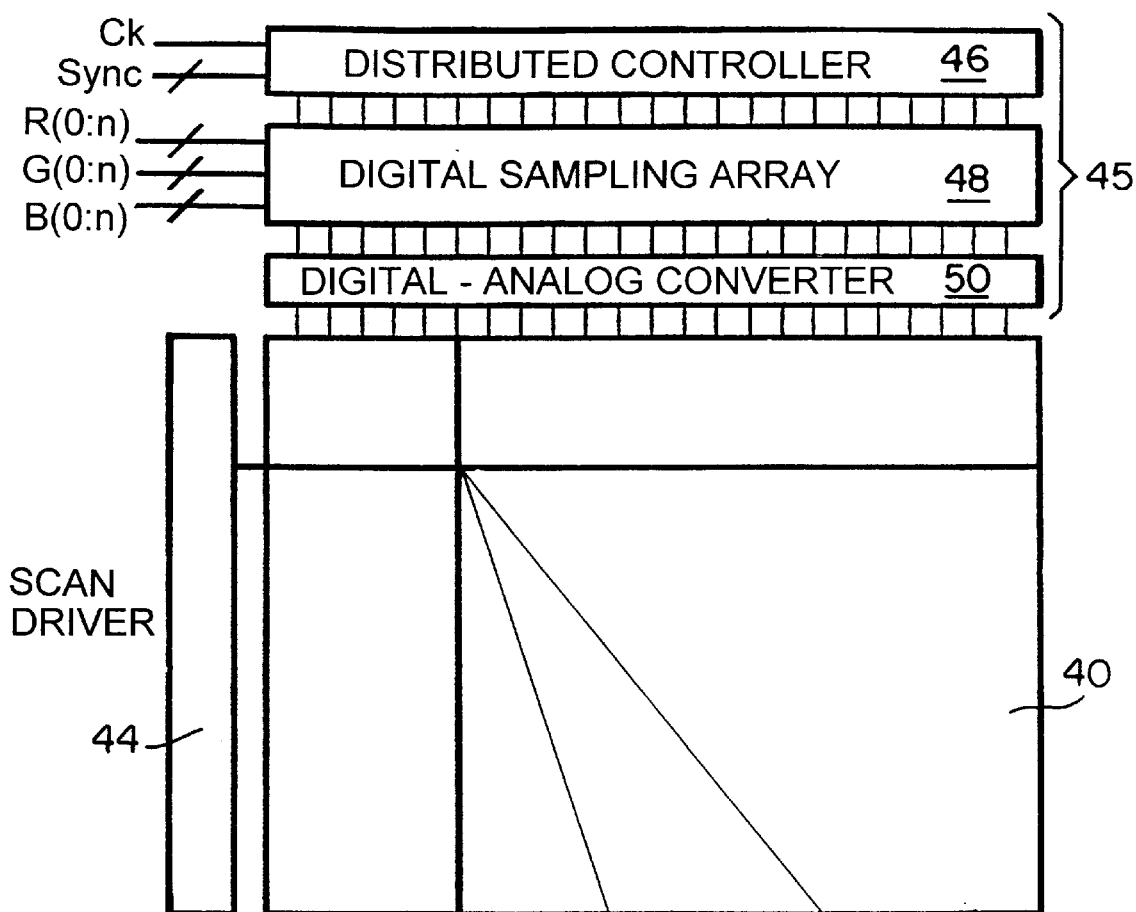
FIGS. 7A and 7B are a schematic view of an active matrix display and associated data and scan drivers.

FIGS. 7A and 7B illustrate an application of the invention to the field of monolithic digital data drivers for active matrix displays. An active matrix display 40 comprising a plurality of liquid crystal picture elements (LC pixels), one of which is shown enlarged and represented schematically at 42, is controlled by a scan driver 44 and a plurality of data drivers 45 formed from a distributed controller 46, a digital sampling array 48, and plurality of digital-to-analogue converters 50. In this type of display, both the drivers 45 and the active matrix 40 are fabricated using thin film transistors (TFTs), typically polysilicon. It is the combined function of the data line and scan line drivers 45 and 44 to provide analogue data voltages to the electrodes 52 of the LC pixels corresponding to the image data to be displayed.

In a typical digital data driver, the input video data is communicated in n-bit parallel RGB format, with n typically equal to 6 or 8 bits per colour. The display driver may therefore receive up to 24 (ie. 3×8) parallel digital data lines, and so low voltage operation is necessary to minimise power consumption from charging parasitic capacitance. This must be achieved despite the high threshold voltage of the TFTs in the driver.

In this application, each RGB column of the data driver 45 comprises n digital sampling circuits of the type shown in FIG. 5, to sample and store the parallel input data ready for subsequent digital-to-analogue conversion. The PRECHARGE and SAMPLE signals for the sampling circuits in each column are provided by means of the distributed controller 46, which may be of the type disclosed in British Patent Application 9706941.3. In operation, the precharge signal is applied to a particular column while a previous column is sampling the data on the input lines. Once the sampling circuits are precharged, the precharge signal for that column goes low and the column is ready to sample the data lines. At the appropriate moment, when the data on the input lines corresponds to the particular column in question, the distributed controller 46 generates the sample pulse for that column and the data currently on the input lines is sampled and stored. The process is repeated for each column in the driver 45 until a line of data has been sampled. Once the data is stored, the conversion from digital to analogue format and subsequent data line charging can proceed in any suitable manner.

What is claimed is:

1. A voltage level converter for converting an input signal at a first voltage level to an output signal at a second voltage level, the converter comprising:
    an input for receiving said input signal;
    an output for outputting said output signal;
    a circuit node;
    precharge and isolation means for charging or discharging said circuit node to a third voltage level during a first time period by connection of said circuit node to a first voltage supply and for isolating said circuit node from said first voltage supply during a second time period;
    input means for changing the voltage at said circuit node in dependence on the voltage at said input during a third time period; and
    output means arranged so that the voltage at said output depends on the voltage at said circuit node.

2. A voltage level converter according to claim 1, wherein said third voltage level is substantially equal to said second voltage level.

3. A voltage level converter according to claim 1, wherein said third time period coincides with, or lies within, said second time period.

4. A voltage level converter according to claim 1, which further comprises an input node which is charged or discharged to a fourth voltage level during said first time period by connection of said input node to a second voltage supply.

5. A voltage level converter according to claim 4, wherein said precharge and isolation means isolates said input node from said second voltage supply during said second time period.

6. A voltage level converter according to claim 4, wherein said second voltage supply is negatively biased with respect to said input signal.

7. A voltage level converter according to claim 4, wherein said precharge and isolation means comprises a first isolation field effect transistor the source and drain of which are connected between said second voltage supply and said input node.

8. A voltage level converter according to claim 1, wherein said precharge and isolation means comprises a second isolation field effect transistor the source and drain of which are connected between said first voltage supply and said circuit node.

9. A voltage level converter according to claim 1, wherein said input means comprises a sampler for sampling said input signal during said third time period.

10. A voltage level converter according to claim 9, wherein said sampler comprises a sampling field effect transistor the gate of which is connected to a sampling signal.

11. A voltage level converter according to claim 4, wherein said input means comprises a sampler for sampling said input signal during said third time period, wherein said sampler comprises a sampling field effect transistor the gate of which is connected to a sampling signal, and wherein the source and drain of said sampling field effect transistor are connected between said input and said input node.

12. A voltage level converter according to claim 1, which further comprises a latch for latching said output signal at the voltage determined by said input means.

13. A voltage level converter according to claim 4, which further comprises a feedback field effect transistor, the source and drain of which are connected between said first voltage supply and said input node, and the gate of which is connected to said circuit node.

14. A voltage level converter according to claim 1, wherein said output means comprises a CMOS inverter, the input of which is connected to said circuit node.

15. A voltage level converter according to claim 1, wherein said input means comprises an input field effect transistor arranged to discharge said circuit node when said input signal is at a logic high level during said third time period.

16. A voltage level converter according to claim 4, wherein said input means comprises an input field effect transistor arranged to discharge said circuit node when said input signal is at a logic high level during said third time period, and wherein the source and drain of said input field effect transistor are connected between said circuit node and said second voltage supply, and the gate of said input field effect transistor is connected to said input node.

17. A voltage level converter according to claim 16, wherein the source of said input field effect transistor is connected to said second voltage supply.

18. A voltage level converter according to claim 17, wherein the gate of said input field effect transistor is connected to said first voltage supply during said first time period, and isolated from said first voltage supply during said second time period.

19. A voltage level converter according to claim 1, wherein said input and output signals are digital signals.

20. An active matrix liquid crystal display comprising:

a scan line driver; and a data line driver comprising a voltage level converter for converting an input signal at a first voltage level to an output signal at a second voltage level, the converter comprising:

an input for receiving said input signal;

an output for outputting said output signal;

a circuit node;

precharge and isolation means for charging or discharging said circuit node to a third voltage level during a first time period by connection of said circuit node to a first voltage supply and for isolating said circuit node from said first voltage supply during a second time period;

input means for changing the voltage at said circuit node in dependence on the voltage at said input during a third time period; and output means arranged so that the voltage at said output depends on the voltage at said circuit node.

* * * * *